United States Patent
Ryu et al.

(10) Patent No.: US 7,959,321 B2
(45) Date of Patent: Jun. 14, 2011

(54) BACKLIGHT PANEL EMPLOYING WHITE LIGHT EMITTING DIODE HAVING RED PHOSPHOR AND GREEN PHOSPHOR

(75) Inventors: Seung Ryeol Ryu, Bucheon-si (KR); Seok Jin Kang, Gwangmyeong-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 646 days.

(21) Appl. No.: 11/909,700

(22) PCT Filed: Mar. 13, 2006

(86) PCT No.: PCT/KR2006/000885
§ 371 (c)(1),
(2), (4) Date: Sep. 25, 2007

(87) PCT Pub. No.: WO2006/104319
PCT Pub. Date: Oct. 5, 2006

(65) Prior Publication Data
US 2010/0177534 A1 Jul. 15, 2010

(30) Foreign Application Priority Data
Mar. 31, 2005 (KR) .................. 10-2005-0027133

(51) Int. Cl.
*F21V 9/00* (2006.01)
(52) U.S. Cl. ............ 362/231; 362/84; 362/97.1; 257/98
(58) Field of Classification Search .................. 362/612, 362/614, 615, 617–619, 231, 84; 257/88, 257/100; 313/502–504
See application file for complete search history.

(56) References Cited

U.S. PATENT DOCUMENTS

| | | | |
|---|---|---|---|
| 3,639,254 A | 2/1972 | Peters | |
| 4,065,688 A | 12/1977 | Thornton | |
| 4,303,913 A | 12/1981 | Tohda et al. | |
| 4,563,297 A | 1/1986 | Kukimoto et al. | |
| 5,208,462 A | 5/1993 | O'Connor et al. | |
| 5,598,059 A | 1/1997 | Sun | |
| 5,834,053 A | 11/1998 | Dye et al. | |
| 6,252,254 B1 | 6/2001 | Soules et al. | |
| 6,417,019 B1 | 7/2002 | Mueller et al. | |

(Continued)

FOREIGN PATENT DOCUMENTS

CN 1584703 2/2005

(Continued)

OTHER PUBLICATIONS

Chinese Office Action dated Aug. 29, 2008.

(Continued)

*Primary Examiner* — Ali Alavi
(74) *Attorney, Agent, or Firm* — H.C. Park & Associates, PLC

(57) ABSTRACT

Disclosed is a backlight panel employing a white light emitting diode. The white light emitting diode includes a blue light emitting diode chip and red and green phosphors positioned over the blue light emitting diode chip. Accordingly, since the backlighting can be performed using white light with distinct red, green and blue wavelengths, the color reproducibility can be enhanced. Further, since the white light can be implemented with a single light emitting diode, the manufacturing costs and thickness of the backlight panel can also be reduced.

12 Claims, 2 Drawing Sheets

U.S. PATENT DOCUMENTS

| | | |
|---|---|---|
| 6,501,102 B2 | 12/2002 | Mueller-Mach et al. |
| 6,521,915 B2 | 2/2003 | Odaki et al. |
| 6,617,782 B2 | 9/2003 | Cheong et al. |
| 6,680,569 B2 | 1/2004 | Mueller-Mach et al. |
| 6,686,691 B1 | 2/2004 | Mueller et al. |
| 6,695,982 B2 | 2/2004 | Ellens et al. |
| 6,762,551 B2 | 7/2004 | Shiiki et al. |
| 6,783,700 B2 | 8/2004 | Tian et al. |
| 2003/0076669 A1 | 4/2003 | Itoh et al. |
| 2003/0228412 A1 | 12/2003 | Chen |
| 2004/0104391 A1 | 6/2004 | Maeda et al. |
| 2004/0124758 A1 | 7/2004 | Danielson et al. |
| 2005/0046334 A1 | 3/2005 | Fujiwara |
| 2005/0123243 A1 | 6/2005 | Steckl et al. |
| 2005/0135118 A1 | 6/2005 | Takata |
| 2005/0224828 A1 | 10/2005 | Oon et al. |
| 2005/0236958 A1 | 10/2005 | Wang et al. |
| 2005/0254258 A1* | 11/2005 | Lee .............................. 362/612 |
| 2005/0276074 A1 | 12/2005 | Ryu |
| 2006/0082296 A1 | 4/2006 | Chua et al. |
| 2009/0295272 A1 | 12/2009 | Oshio |

FOREIGN PATENT DOCUMENTS

| | | |
|---|---|---|
| DE | 10028266 | 12/2001 |
| JP | 57-128772 | 8/1982 |
| JP | 2927279 | 5/1999 |
| JP | 2000-171796 | 6/2000 |
| JP | 2002-531956 | 6/2000 |
| JP | 2002-060747 | 2/2002 |
| JP | 2002-156531 | 5/2002 |
| JP | 2003-203504 | 7/2003 |
| JP | 2003-315796 | 11/2003 |
| JP | 2004-094031 | 3/2004 |
| JP | 2004-119375 | 4/2004 |
| JP | 2004119743 | 4/2004 |
| JP | 2004-161807 | 6/2004 |
| JP | 2004296830 | 10/2004 |
| JP | 2004-327492 | 11/2004 |
| JP | 2005-019997 | 1/2005 |
| JP | 2005-079500 | 3/2005 |
| KR | 10-2001-0089508 | 10/2001 |
| KR | 10-2001-0101761 | 11/2001 |
| KR | 1020010097147 | 11/2001 |
| KR | 10-2002-0027538 | 4/2002 |
| KR | 10-2002-0067818 | 8/2002 |
| KR | 10-2004-0000004 | 1/2004 |
| KR | 10-2004-0088418 | 10/2004 |
| KR | 10-2005-0117165 | 12/2005 |
| KR | 10-2006-0028932 | 4/2006 |
| KR | 10-2006-0063586 | 6/2006 |
| KR | 10-0601200 | 7/2006 |
| KR | 10-2007-0002385 | 1/2007 |
| KR | 10-0700231 | 3/2007 |
| TW | 563261 | 11/2003 |
| WO | WO9805078 | 2/1998 |
| WO | 00/33390 | 6/2000 |
| WO | 01/24229 | 4/2001 |
| WO | 02-11173 | 2/2002 |
| WO | 02/098180 | 12/2002 |
| WO | 03/021691 | 3/2003 |
| WO | 03/080763 | 10/2003 |
| WO | 03/081957 | 10/2003 |
| WO | 03/107441 | 12/2003 |
| WO | 2004-007636 | 1/2004 |
| WO | 2005/026285 | 3/2005 |
| WO | 2006-126817 | 11/2006 |

OTHER PUBLICATIONS

Non-Final Office Action of U.S. Appl. No. 12/904,219 issued on Mar. 3, 2011.
"TW Preliminary Notice of First Office Action Dated Oct. 2, 2009, corresponding to U.S. Appl. No. 11/912,383."
"Communication with Supplementary European Search Report dated Aug. 4, 2010, corresponding to U.S. Appl. No. 11/912,383."
"International Search Report of PCT/KR2006/001921 dated Aug. 31, 2006, corresponding to U.S. Appl. No. 11/912,383."
"Non-Final Office Action of U.S. Appl. No. 11/912,383 issued on Jun. 29, 2010, corresponding to U.S. Appl. No. 11/912,383."
"Non-Final Office Action of U.S. Appl. No. 11/912,383 issued on Nov. 10, 2010, corresponding to U.S. Appl. No. 11/912,383."
Extended European Search Report dated Feb. 16, 2009.
International Search Report of PCT/KR2006/000961 dated Dec. 11, 2006.
Chinese Office Action dated Feb. 5, 2010 in Chinese Patent App. No. 200680018490.1, corresponding to U.S. Appl. No. 11/912,384.
International Search Report of PCT/KR2006/001923 dated on Aug. 31, 2006, corresponding to U.S. Appl. No. 11/912,384.
Non-Final Office Action of U.S. Appl. No. 11/912,384 issued on Sep. 9, 2010, corresponding to U.S. Appl. No. 11/912,384.
Notice of Allowance of U.S. Appl. No. 11/912,384 issued on Feb. 2, 2011, corresponding to U.S. Appl. No. 11/912,384.
E. Philippot et al., "Relation Between properties and structural evolution of some Si, Ge Sn Ternary chalogenides", (1997), React, Solids [Proc. Int. Symp.]. 8th, Meeting date 1976, pp. 535-539, corresponding to U.S. Appl. No. 11/913,538.
Baur et al. " White Light Emitting Diodes", (1998), Adv. Solid State Phys., vol. 67, pp. 67-78, corresponding to U.S. Appl. No. 11/913,538.
International Search Report of PCT/KR2006/002330 dated on Oct. 9, 2006, corresponding to U.S. Appl. No. 11/913,538.
Non-Final Office Action of U.S. Appl. No. 11/913,538 issued on Nov. 25, 2008, corresponding to U.S. Appl. No. 11/913,538.
Final Office Action of U.S. Appl. No. 11/913,538 issued on Apr. 17, 2009, corresponding to U.S. Appl. No. 11/913,538.
Non-Final Office Action of U.S. Appl. No. 11/913,538 issued on Jul. 31, 2009, corresponding to U.S. Appl. No. 11/913,538.
Final Office Action of U.S. Appl. No. 11/913,538 issued on Mar. 25, 2010, corresponding to U.S. Appl. No. 11/913,538.
Notice of Allowance of U.S. Appl. No. 11/913,538 issued on Oct. 25, 2010, corresponding to U.S. Appl. No. 11/913,538.
Notice of Allowance of U.S. Appl. No. 11/912,383 issued on Feb. 23, 2011, corresponding to U.S. Appl. No. 11/912,383.

* cited by examiner

BACKLIGHT PANEL EMPLOYING WHITE LIGHT EMITTING DIODE HAVING RED PHOSPHOR AND GREEN PHOSPHOR

TECHNICAL FIELD

The present invention relates to a backlight panel for backlighting a display panel, and more particularly, to a backlight panel employing a white light emitting diode with red and green phosphors as a light source to enhance color reproducibility and luminance.

BACKGROUND ART

A passive display device such as a liquid crystal display (LCD) reflects or absorbs ambient sunlight or indoor light to display images on an LCD panel. Thus, the ambient sunlight or indoor light is required for a user to view the displayed image. However, in a case where intensity of the ambient sunlight or indoor light is not sufficient to illuminate a display panel, there is a problem in that the user cannot view the displayed image. As an alternative to such a problem, a backlight panel for backlighting a display panel is generally employed.

A backlight panel includes a light source such as an incandescent lamp, fluorescent lamp or light emitting diode (LED). Light emitted from the light source illuminates the LCD panel, and thus, images are implemented. Meanwhile, since the LED has superior reproducibility, it has been frequently used as a backlight source. In addition, since the LED is environmentally friendly, it is expected that its use will be further increased in the future.

FIG. 1 is a partial sectional view illustrating a conventional backlight panel for backlighting an LCD panel 17 using light emitting diodes (LEDs).

Referring to FIG. 1, an LED array is arranged on a printed circuit board 1. The LED array is an array in which red, green and blue LEDs 3r, 3g and 3b are arranged at a predetermined interval. The LEDs are arranged on the printed circuit board 1 in a regular order and constructed into an LED module, and a plurality of LED modules are used to backlight the LCD panel 17.

Each of the LEDs employs a lens designed for side-luminescence such that major light can be radiated almost in a side direction.

A reflection sheet 5 is positioned below light exit surfaces of the LEDs. The reflection sheet may be formed with a reflection layer 5a on the top thereof. The reflection sheet reflects light emitted from the LEDs in an upward direction.

Furthermore, a light transmission layer 7 is positioned above the LEDs. The light transmission layer is a layer through which light emitted from the LED can be transmitted. The light transmission layer is generally made of a transparent resin such as PMMA (poly methyl methacrylate). The light transmission layer 7 is provided with light shielding patterns 9 at positions corresponding to the LEDs. The light shielding patterns function to prevent light emitted upward from the LEDs from penetrating the light transmission layer and then traveling toward the LCD panel 17. The light shielding patterns may be formed through an ESR (eletroslag remelting) process.

The light transmission layer 7 and the reflection sheet 5 are spaced apart at a predetermined interval to define a first gap 6a which is an air layer. The first gap is a region where red, green and blue light emitted respectively from the LEDs 3r, 3g and 3b are mixed with one another.

A diffusion plate 11 is positioned above and spaced apart from the light transmission layer 7. The diffusion plate 11 diffuses light incident thereon to make the light uniform. The diffusion plate and the light transmission layer 7 are spaced apart from each other by a predetermined interval to define a second gap 10a which is an air layer. Thus, the light transmitted through the light transmission layer 7 is again mixed within the second gap 10a and the mixed light is then incident onto the diffusion plate 11.

A brightness enhancement film (BEF) 13 such as a prism sheet is positioned on a top surface of the diffusion plate 11. The BEF may be composed of two sheets which have upward prisms formed in longitudinal and transverse directions, respectively. In addition, a dual brightness enhancement film (DBEF) 15 such as a dual brightness enhancement film-embossed (DBEF-E) is positioned on a top surface of the BEF 13. The BEFs 13 and 15 refract light emitted at a large showing angle from the diffusion plate 11 into light with a small showing angle such that the light can be incident onto the LCD panel 17. Accordingly, the luminance of the LCD panel is increased.

Since the red, green and blue LEDs are used as light sources according to a prior art, the color reproducibility can be enhanced. However, it is necessary to mix light emitted from the LEDs in order to obtain the uniform light. Accordingly, it is necessary to prevent light emitted from the LEDs from transmitting directly through the light transmission layer 7 and traveling toward the diffusion plate 11 by using the light shielding pattern 9. Further, air layers such as the first and second gaps 6a and 10a are required. These result in an increase in thickness of a backlight panel.

Further, while light emitted from the LEDs is mixed, light loss is generated. Thus, such light loss should be compensated by increasing an amount of current supplied to the LEDs, by using a larger number of LEDs or by using the BEF 13, the DBEF 15 and the like. However, in a case where the amount of current is increased or a large number of LEDs are used, power consumption is increased. In particular, the increase in the amount of current leads to an increase of heat generated from the LEDs, and the light shielding layer may be deteriorated. In addition, the use of the BEFs causes the total thickness of the backlight panel to be further increased and the manufacturing costs of the backlight panel to be increased.

Technical Problem

An object of the present invention is to provide a backlight panel which has smaller thickness and reduced manufacturing costs as compared with a conventional backlight panel.

Another object of the present invention is to provide a backlight panel capable of enhancing its luminance as compared with a conventional backlight panel.

Technical Solution

In order to achieve the above objects of the present invention, there is provided a backlight panel employing a white light emitting diode with red and green phosphors. A backlight panel according to an aspect of the present invention comprises a light guide plate for emitting light incident from a side direction. The light guide plate emits light through a top surface thereof. The white light emitting diodes are arranged at a side of the light guide plate to emit white light into the light guide plate. Each of the white light emitting diodes includes a blue light emitting diode chip and red and green phosphors positioned over the blue light emitting diode chip. Furthermore, a diffusion plate is positioned over the top surface of the light guide plate. Therefore, the color reproducibility of a liquid crystal display can be ensured and the thickness of the backlight panel can also be reduced, by employing the white light emitting diode with three red, green and blue wavelengths.

Further, a brightness enhancement film and/or a dual brightness enhancement film may be positioned over the diffusion plate. The brightness enhancement films can enhance the luminance of the backlight panel.

A backlight panel according to another aspect of the present invention comprises a diffusion plate having a top surface and a bottom surface. White light emitting diodes are arranged below the bottom surface of the diffusion plate at a predetermined interval from the diffusion plate. Each of the white light emitting diodes includes a blue light emitting diode chip and red and green phosphors positioned over the blue light emitting diode chip. Furthermore, a reflection sheet is positioned below light exit surfaces of the white light emitting diodes and also allows light traveling in a direction opposite to the diffusion plate to be reflected toward the diffusion plate. Therefore, the color reproducibility of a liquid crystal display can be ensured and spaces or gaps where light is mixed can also be reduced, so that the thickness of the backlight panel can be reduced. Further, since the luminance can be enhanced with the use of a light source for upward emitting light, brightness enhancement films can be omitted.

In addition, a brightness enhancement film and/or a dual brightness enhancement film may be positioned over the diffusion plate to further increase the luminance of the backlight panel.

Preferably, the red phosphor of the present invention is a phosphor that is excited by blue light emitted from the blue light emitting diode chip to radiate red light. The red phosphor may be an alkali earth metal sulfide-based red phosphor expressed as general formula, $A_{x-a}Eu_aGeS_z$, where A is at least one element selected from the group consisting of Ca and Sr; $z=x+2$; x is set within a range of about 2 to about 5; and a/x is set within a range of about 0.0005 to about 0.02.

Preferably, the green phosphor of the present invention is a phosphor that is excited by blue light emitted from the blue light emitting diode chip to radiate green light. The green phosphor may be a thiogallate-based green phosphor expressed as general formula, $(A_{1-x-y}Eu_x(M^I_{0.5}M^{III}_{0.5})_y)B_2S_4$, where $0<x, y, x+y<1$; A is at least one element selected from the group consisting of Ba, Sr and Ca; B is at least one element selected from the group consisting of Al, Ga and In; x is set within a range of about 0.01 to about 0.1; $M^I$ is at least one element selected from the group consisting of Li, Na and K; $M^{III}$ is at least one element selected from the group consisting of Sc, Y, Lu, Gd and La; and y is set within a range of about 0.2 to about 0.8.

Advantageous Effects

According to the embodiments of the present invention, there is provided a backlight panel which has smaller thickness and reduced manufacturing costs as compared with the coventional backlight panel. Further, there is provided a backlight panel having enhanced luminance as compared with the conventional backlight panel.

Meanwhile, in a case where the red, green and blue LEDs are used as described in the prior art, the life spans and degrees of deterioration of the LEDs are different from one another. Thus, a color sensor should be installed on the LCD panel to detect the deterioration of the LEDs and to perform a compensation work. However, since the white LEDs of the same kinds are used in the embodiments of the present invention, the life spans and deterioration of the LEDs are generally similar to one another. Therefore, it is less necessary to use the color sensor and perform the compensation work. Accordingly, an operation circuit of the LCD panel can be further simplified.

MODE FOR INVENTION

Figure 1:
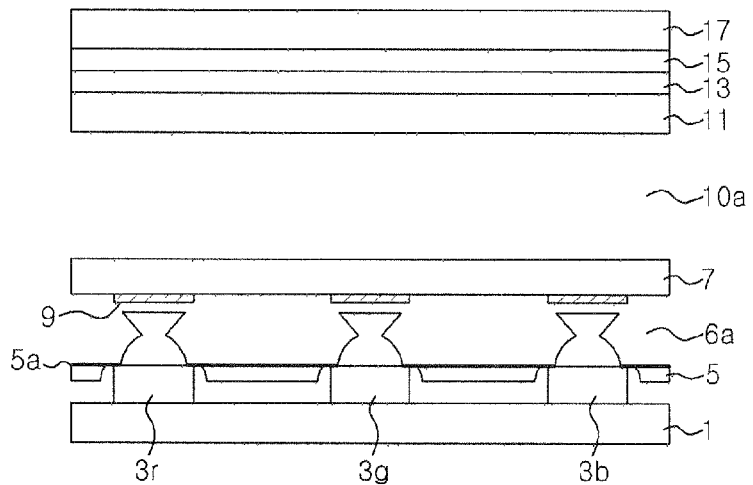
FIG. 1 is a sectional view illustrating a conventional backlight panel.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other fowls. In the drawings, the widths, lengths, thicknesses and the like of components may be exaggerated for convenience of illustration. Like reference numerals indicate like elements throughout the specification and drawings.

Figure 2:
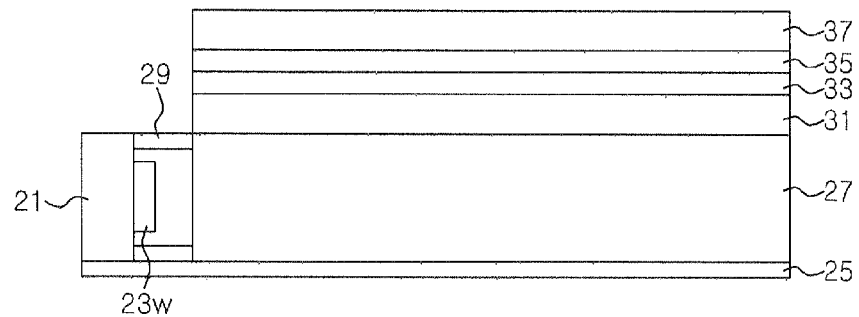
FIG. 2 is a sectional view illustrating a backlight panel according to an aspect of the present invention.

FIG. 2 is a sectional view illustrating a backlight panel for backlighting a liquid crystal display panel 37 (hereinafter, referred to as "LCD panel") according to an aspect of the present invention.

Referring to FIG. 2, a light guide plate 27 is positioned below the LCD panel 37. The light guide plate converts light emitted from a light source 23w into surface light and then emits the surface light upward toward the LCD panel. The light guide plate 27 may be made of glass, a transparent resin such as a transparent acryl resin or a polycarbonate or epoxy resin, or the like. Both surfaces of the light guide plate may be machined with a variety of patterns such as V-shaped grooves, lens shapes, prism shapes or hologram patterns, if necessary. Further, a reflection sheet 25 may be positioned on a bottom surface of the light guide plate.

White light emitting diodes (hereinafter, referred to as "LEDs") are positioned adjacent to a side of the light guide plate. Each of the white LEDs emits white light toward the side of the light guide plate 27. The white LED may be mounted on a printed circuit board 21, and a plurality LEDs may be mounted on the printed circuit board 21 as an LED module. The LEDs 23w mounted on the printed circuit board 21 may be simultaneously driven through a circuit printed on the printed circuit board. Meanwhile, the LEDs may be positioned at both sides of the light guide plate 27. Accordingly, the luminance of the LCD panel 37 can be further enhanced.

The white LED 23w includes a blue LED chip, and green and red phosphors which are positioned over the blue LED chip to convert a portion of blue light into green and red light, respectively. The white LED 23w will be described in detail later with reference to FIG. 5.

Meanwhile, light shielding walls 29 are positioned above and below the white LED 23w, respectively. The light shielding walls prevent light emitted from the white LED 23w from traveling toward regions other than the side of the light guide plate 27. A reflection layer is coated on an inner wall of the light shielding wall 29 to enable light incident onto the light shielding wall to be reflected. Such a reflection layer may be also formed on a top surface of the printed circuit board 21.

A diffusion plate 31 is positioned over top surface of the light guide plate 27. The diffusion plate 31 may be a thin sheet. The diffusion plate 31 diffuses light incident from the light guide plate 27 into uniform light. Moreover, a brightness enhancement film (BEF) 33 and/or a dual brightness enhancement film (DBEF) 35 may be interposed between the diffusion plate 31 and the LCD panel 37. The BEFs 33 and 35 collect light emitted from the light guide plate 27 within a certain showing angle to increase the luminance of light.

Since the backlight panel according to the aspect of the present invention is mounted with the white LED to enable uniform white light to be emitted from the LED, an air layer used for mixing the red, green and blue light with one another is not necessary, as compared with the prior art. Thus, the thickness of the backlight panel can be decreased. Further, since light emitted from the white LED is incident directly onto the light guide plate 27, the light emitting luminance can be enhanced. Thus, the BEFs 33 and 35 may be omitted. Furthermore, in a case where the BEFs are used, the luminance can be further enhanced. Thus, the number of LEDs used can also be reduced.

Figure 3:
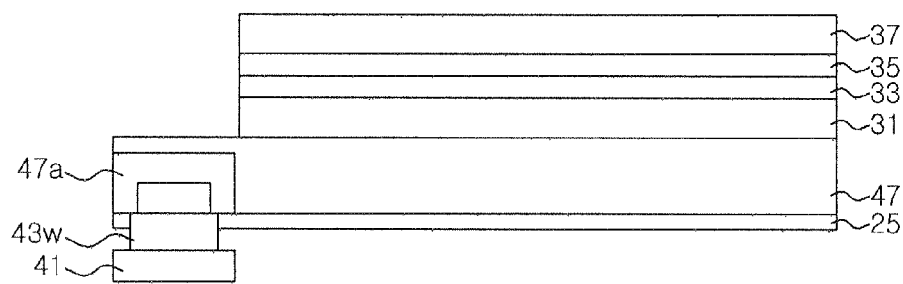
FIG. 3 is a sectional view illustrating another embodiment of the backlight panel according to the aspect of the present invention.

FIG. 3 is a sectional view illustrating another embodiment of the backlight panel according to the aspect of the present invention.

Referring to FIG. 3, the diffusion plate 31, the BEFs 33 and 35, and the LCD panel 37 are provided in the same manner as described with reference to FIG. 2. Hereinafter, only differences between the backlight panels of FIGS. 2 and 3 will be described in detail.

A light guide plate 47 is positioned below the diffusion plate 31. The light guide plate 47 is formed with a receiving groove 47a at a side thereof to accommodate LEDs in the receiving groove. As described with reference to FIG. 2, the light guide plate 47 may be made of glass, a transparent resin such as a transparent acryl resin or a polycarbonate or epoxy resin, or the like. Further, both surfaces of the light guide plate may be machined with a variety of patterns such as V-shaped grooves, lens shapes, prism shapes or hologram patterns, if necessary. Furthermore, the reflection sheet 25 can be positioned on a bottom surface of the light guide plate. The reflection sheet 25 may be attached to the bottom surface of the light guide plate 47 to extend to the side thereof and have a through-hole through which the LEDs can be received in the receiving groove 47a of the light guide plate 47.

A white LED 43w is accommodated in the receiving groove 47a. The white LED is a side-view LED which emits light almost in parallel with top and bottom surfaces of the light guide plate 47, i.e. perpendicular to the side surfaces thereof. The side-view LED can adjust a showing angle of emitted light to be smaller than that of an LED emitting light upward, so that the thickness of the light guide plate 47 can be reduced.

The white LED may be mounted on a printed circuit board 41, and a plurality LEDs may also be mounted on the printed circuit board 41 as an LED module. The LEDs 43w mounted on the printed circuit board 41 may be simultaneously driven through a circuit printed on the printed circuit board. Meanwhile, the LEDs may be positioned at both sides of the light guide plate 47. Accordingly, the luminance of the LCD panel 37 can be further enhanced.

According to this embodiment, the side-view LED capable of adjusting a showing angle to be smaller is mounted such that the thickness of the light guide plate can be reduced.

Figure 4:
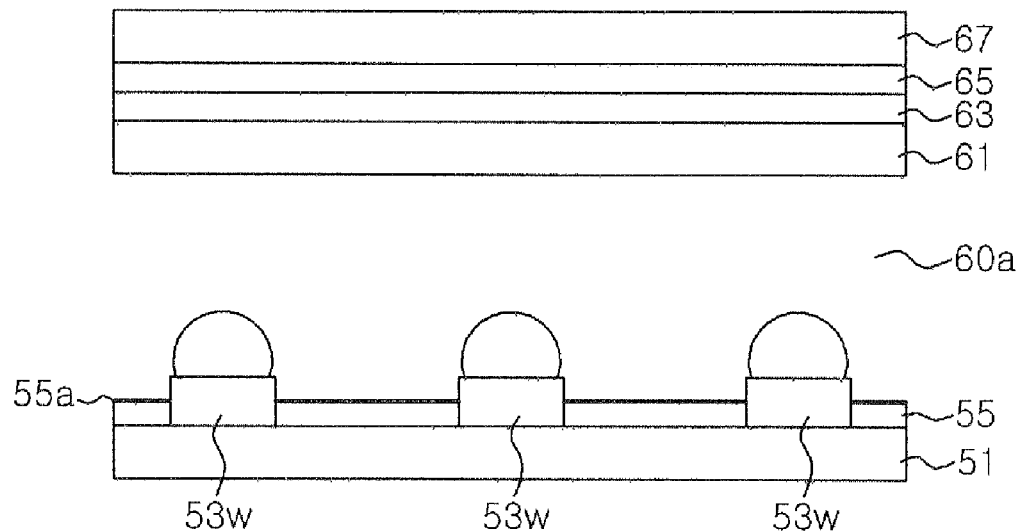
FIG. 4 is a sectional view illustrating a backlight panel according to another aspect of the present invention.

FIG. 4 is a sectional view illustrating a backlight panel according to another aspect of the present invention.

Referring to FIG. 4, a diffusion plate 61 is positioned below an LCD panel 67. The diffusion plate has a top surface and a bottom surface. BEF 63 and/or DBEF 65 may be interposed between the diffusion plate and the LCD panel 67.

Meanwhile, white LEDs 53w are arranged below the bottom surface of the diffusion plate 61 at a certain interval from the diffusion plate 61. Each of the white LEDs 53w includes a blue LED chip, and green and red phosphors positioned over the blue LED chip. The white LEDs 53w will be described in detail later with reference to FIG. 5.

Each of the white LEDs 53w emits white light toward the diffusion plate 61. The white LED may be mounted on a printed circuit board 51, and a plurality LEDs may be mounted on the printed circuit board 51 as an LED module. The LEDs 53w mounted on the printed circuit board 51 may be simultaneously driven through a circuit printed on the printed circuit board. A plurality of LED modules may be arranged below the diffusion plate 61 to uniformly backlight the LCD panel 67.

Furthermore, a reflection sheet 55 is positioned below light exit surfaces of the white LEDs 53w. The reflection sheet 55 may be formed with a reflection layer 55a thereon. The reflection sheet may be made of an aluminum sheet and coated with the reflection layer 55a thereon. Further, the reflection sheet 55 may be attached onto the printed circuit board 51 as shown in this figure.

The reflection sheet 55 and the diffusion plate 61 are spaced apart from each other by a predetermined interval to define a gap 60a corresponding to an air layer. White light emitted from the white LEDs 53w are mixed with one another in the gap 60a and then incident onto the diffusion plate 61.

The backlight panel according to this aspect does not use an additional light guide plate. Thus, the diffusion plate 61 may be thicker than the diffusion plate 31 of FIG. 2 or 3 such that light emitted from the white LEDs 53w can be uniform.

In the meantime, since the backlight panel according to this aspect employs top-view white LEDs contrary to the prior art, the light transmission layer 7 (FIG. 1) formed with the light shielding pattern 9 (FIG. 1) may be omitted. Further, since light emitted from the white LEDs 53w is incident directly onto the diffusion plate 61, the light loss can be reduced so that the luminance of the LCD panel 67 can be enhanced. Accordingly, since the BEF 63 and the DBEF 65 can be omitted, the thickness of the backlight panel can also be reduced.

Figure 5:
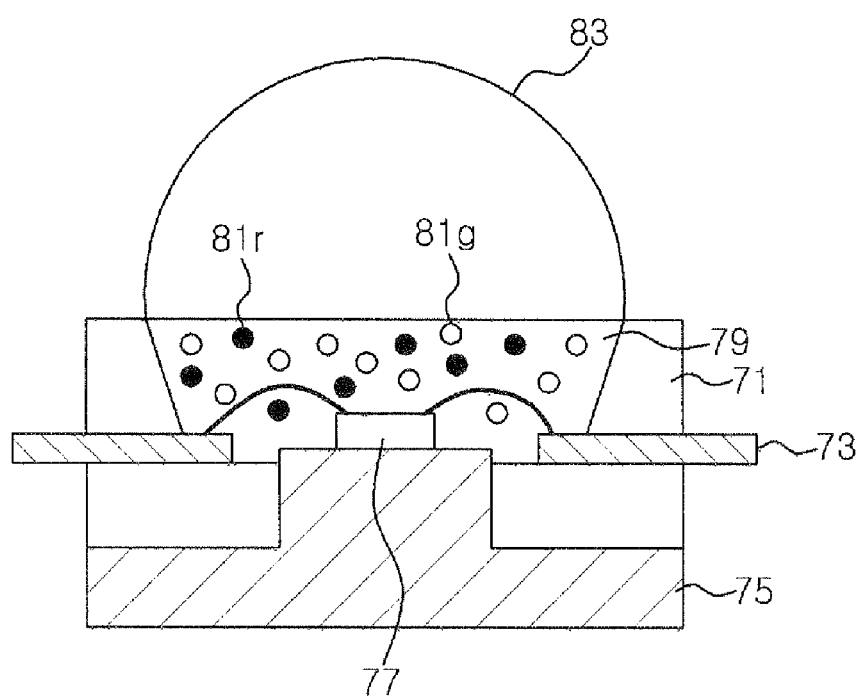
FIG. 5 is a sectional view illustrating a white light emitting diode of the present invention.

FIG. 5 is a sectional view illustrating the white LED 23w, 43w or 53w used in the embodiments of the present invention.

Referring to FIG. 5, the white LED includes a package body 71. The package body may be formed using an injection molding, pressing or machining technique, and particularly injection-molded using a plastic resin. The package body is formed with a cavity which exposes lead terminals 73. Further, a sidewall of the cavity may be an inclined surface inclined at a certain angle.

The lead terminals 73 extend outward to protrude out of the package body 71. The lead terminals 73 protruding to the outside are connected to a printed circuit board and electrically connected to an external power source. The lead terminals 73 may be bent from the outside such that they can be surface mounted.

Meanwhile, a heat sink 75 may be attached to the bottom of the package body 71. The heat sink is provided to easily dissipate heat generated from an LED chip 77 to the outside. The heat sink 75 may be formed with a base and a projection protruding upward from a center portion of the base. The projection is inserted into the package body and then exposed to the cavity. After the package body 71 has been formed with a through-hole, the heat sink can be inserted into the through-hole of the package body and mounted to the package body. Alternatively, the heat sink 75 can be attached to the package body 71 by positioning the lead terminals 73 and the heat sink 75 and then forming the package body using an insert-molding technique. The heat sink 75 may be electrically isolated from the lead terminals 75, or electrically connected to any one of the lead terminals.

A blue LED chip 77 for emitting blue light is mounted on the heat sink 75. The LED chip 77 is a GaN, InGaN or AlGaInN-based light emitting diode and radiates blue light with a wavelength of about 420 to about 480 nm. The LED chip 77 has two electrodes for the connection with an external source. The electrodes may be positioned on the same side or opposite sides of the LED 77. The electrodes may be electrically connected to the lead terminals through an adhesive or bonding wires as shown in this figure. In a case where the electrodes are formed on the same side of the LED chip, the LED chip 77 and the lead terminals are connected through the two bonding wires, respectively, so that they can be electrically connected as shown in this figure. On the other hand, in a case where the electrodes are positioned on the opposite sides, one of the electrodes is connected to the heat sink 75 using a conductive adhesive and one of the lead terminals is connected to the heat sink 75 through the bonding wire, so that the lead terminals and the LED chip 77 can be electrically connected with each other.

Over the blue LED chip 77 is positioned red and green phosphors 81$r$ and 81$g$ which are excited by blue light to radiate red and green light, respectively, such that the radiated light is mixed with a portion of blue light emitted from the LED chip 77 to become white light. The red and green phosphors may be either coated on the LED chip 77 or positioned in a molding member 79 in a state where they are contained therein as shown in this figure. The molding member 79 may be made of an epoxy or silicone resin and formed into a single layer or multiple layers.

For example, the red phosphor 81$r$ may be an alkali earth metal sulfide-based red phosphor, while the green phosphor 81$g$ may be a thiogallate-based green phosphor. More specifically, the alkali earth metal sulfide-based red phosphor is expressed as general formula $A_{x-a}Eu_aGeS_z$, where A is Ca and/or Sr, $z=x+2$, x is set within a range of 2 to 5, and a/x is set within a range of about 0.0005 to about 0.02.

Further, the thiogallate-based green phosphor is expressed as general formula $(A_{1-x-y}Eu_x(M^I_{0.5} M^{III}_{0.5})_y)B_2S_4$, where A is at least one element selected from the group consisting of Ba, Sr and Ca, B is at least one element selected from the group consisting of Al, Ga and In, and $0<x, y, x+y<1$. Preferably, x is set within a range of about 0.01 to about 0.1. Meanwhile, $M^I$ is at least one element selected from the group consisting of Li, Na and K, and $M^{III}$ is at least one element selected from the group consisting of Sc, Y, Lu, Gd and La. Preferably, y is set within a range of about 0.2 to about 0.8.

Such red and green phosphors 81$r$ and 81$g$ are obtained in the following manners. That is, phosphor raw materials and an activator raw material are weighted to have a predetermined mixing ratio in accordance with a desired composition and sufficiently mixed into a uniform mixture by using a ball milling or a mixer such as agate mortar within an alcohol solvent for effective mixing. Then, the mixture is dried in an oven at a temperature of about 100 to about 150° C. for about 1 to 2 hours. The dried mixture is heat-treated in a high-purity alumina boat at a temperature of about 800 to about 1300° C. under the atmosphere of H$_2$S using an electric furnace to synthesize phosphor powder and then sufficiently pulverize the synthesized phosphor powder.

According to the results of measuring photoluminescence (PL) of the powder, the thiogallate-based green phosphor of a typical composition expressed as $Sr_{0.36}Eu_{0.04}Y_{0.3}Li_{0.3}Ga_2S_4$ exhibits strong photoluminescence spectrum throughout a region of 470 to 630 nm while the alkali earth metal sulfide-based red phosphor expressed as $Sr_{2.185}Eu_{0.015}Ca_{0.8}GeS_5$ exhibits strong photoluminescence spectrum throughout a region of 520 to 780 nm. Accordingly, white light with distinct red, green and blue wavelengths can be radiated using the blue LED chip 77 and the phosphors, and thus, the color reproducibility of the LCD panel can be enhanced.

Meanwhile, the LED chip 77 and the phosphors 81$r$ and 81$g$ are covered with a lens 83. The lens may be formed into a variety of shapes. For example, to implement a top-view LED according to the aspects of the present invention, the lens may take the shape of a convex lens as shown in this figure. At this time, the curvature of the lens is determined depending on a desired showing angle. Meanwhile, to implement a side-view LED shown in FIG. 2, the lens is designed to emit light from the LED chip 77 in a side direction. An example of such a side-view LED is shown in FIG. 1, and the other side-view LEDs can be implemented into a variety of lens shapes.

The invention claimed is:

1. A backlight panel, comprising:
a light guide plate for emitting light incident from a side direction, the light guide plate configured to emit light through a top surface thereof;
white light emitting diodes arranged at a side of the light guide plate to emit white light into the light guide plate; and
a diffusion plate positioned over the top surface of the light guide plate,
wherein each of the white light emitting diodes comprises a blue light emitting diode chip and red and green phosphors positioned over the blue light emitting diode chip, and
wherein the red phosphor is an alkaline earth metal sulfide-based red phosphor expressed as general formula, $A_{x-a}Eu_aGeS_z$, where A is at least one element selected from the group consisting of Ca and Sr; $z=x+2$; x is set within a range of 2 to 5; and a/x is set within a range of 0.0005 to 0.02.

2. The backlight panel as claimed in claim 1, further comprising a brightness enhancement film and/or a dual brightness enhancement film over the diffusion plate.

3. The backlight panel as claimed in claim 1, wherein
the green phosphor is a thiogallate-based green phosphor expressed as general formula, $(A_{1-x-y}Eu_x(M^I_{0.5} M^{III}_{0.5})_y)B_2S_4$, where $0<x, y, x+y<1$; A is at least one element selected from the group consisting of Ba, Sr and Ca; B is at least one element selected from the group consisting of Al, Ga and In; x is set within a range of 0.01 to 0.1; $M^I$ is at least one element selected from the group consisting of Li, Na and K; $M^{III}$ is at least one element selected from the group consisting of Sc, Y, Lu, Gd and La; and y is set within a range of 0.2 to 0.8.

4. A backlight panel, comprising:
a diffusion plate having a top surface and a bottom surface;
white light emitting diodes arranged below the bottom surface of the diffusion plate at a predetermined interval from the diffusion plate; and a reflection sheet positioned below light exit surfaces of the white light emitting diodes to allow light traveling in a direction opposite to the diffusion plate to be reflected toward the diffusion plate, wherein each of the white light emitting diodes comprises a blue light emitting diode chip and red and green phosphors positioned over the blue light emitting diode chip, and wherein the red phosphor is an alkaline earth metal sulfide-based red phosphor expressed general formula, $A_{x-a}Eu_aGeS_z$, where A is at least one element selected from the group consisting of Ca and Sr; $z=x+2$; x is set within a range of 2 to 5; and a/x is set within a range of 0.0005 to 0.02.

5. The backlight panel as claimed in claim 4, further comprising a brightness enhancement film and/or a dual brightness enhancement film over the diffusion plate.

6. The backlight panel as claimed in claim 4, wherein the green phosphor is a thiogallate-based green phosphor expressed as general formula, $(A_{1-x-y}Eu_x(M^I_{0.5}M^{III}_{0.5})_y)B_2S_4$, where $0<x, y, x+y<1$; A is at least one element selected from the group consisting of Ba, Sr and Ca; B is at least one element selected from the group consisting of Al, Ga and In; x is set within a range of 0.01 to 0.1; $M^I$ is at least one element selected from the group consisting of Li, Na and K; $M^{III}$ is at least one element selected from the group consisting of Sc, Y, Lu, Gd and La; and y is set within a range of 0.2 to 0.8.

7. A backlight panel, comprising:
a light guide plate for emitting light incident from a side direction, the light guide plate configured to emit light through a top surface thereof;
white light emitting diodes arranged at a side of the light guide plate to emit white light into the light guide plate; and
a diffusion plate positioned over the top surface of the light guide plate,
wherein each of the white light emitting diodes comprises a blue light emitting diode chip and red and green phosphors positioned over the blue light emitting diode chip, and
wherein the green phosphor is a thiogallate-based green phosphor expressed as general formula, $(A_{1-x-y}Eu_x(M^I_{0.5}M^{III}_{0.5})_y)B_2S_4$, where $0<x, y, x+y<1$; A is at least one element selected from the group consisting of Ba, Sr and Ca; B is at least one element selected from the group consisting of Al, Ga and In; x is set within a range of 0.01 to 0.1; $M^I$ is at least one element selected from the group consisting of Li, Na and K; $M^{III}$ is at least one element selected from the group consisting of Sc, Y, Lu, Gd and La; and y is set within a range of 0.2 to 0.8.

8. The backlight panel as claimed in claim 7, wherein the red phosphor is an alkali earth metal sulfide-based red phosphor expressed as general formula, $A_{x-a}Eu_aGeS_z$, where A is at least one element selected from the group consisting of Ca and Sr; $z=x+2$; x is set within a range of 2 to 5; and a/x is set within a range of 0.0005 to 0.02.

9. The backlight panel as claimed in claim 7, further comprising a brightness enhancement film and/or a dual brightness enhancement film over the diffusion plate.

10. A backlight panel, comprising:
a diffusion plate having a top surface and a bottom surface;
white light emitting diodes arranged below the bottom surface of the diffusion plate at a predetermined interval from the diffusion plate; and
a reflection sheet positioned below light exit surfaces of the white light emitting diodes to allow light traveling in a direction opposite to the diffusion plate to be reflected toward the diffusion plate,
wherein each of the white light emitting diodes comprises a blue light emitting diode chip and red and green phosphors positioned over the blue light emitting diode chip, and wherein the green phosphor is a thiogallate-based green phosphor expressed as general formula, $(A_{1-x-y}Eu_x(M^I_{0.5}M^{III}_{0.5})_y)B_2S_4$, where $0<x, y, x+y<1$; A is at least one element selected from the group consisting of Ba, Sr and Ca; B is at least one element selected from the group consisting of Al, Ga and In; x is set within a range of 0.01 to 0.1; $M^I$ is at least one element selected from the group consisting of Li, Na and K; $M^{III}$ is at least one element selected from the group consisting of Sc, Y, Lu, Gd and La; and y is set within a range of 0.2 to 0.8.

11. The backlight panel as claimed in claim 10, wherein the red phosphor is an alkali earth metal sulfide-based red phosphor expressed as general formula, $A_{x-a}Eu_aGeS_z$, where A is at least one element selected from the group consisting of Ca and Sr; $z=x+2$; x is set within a range of 2 to 5; and a/x is set within a range of 0.0005 to 0.02.

12. The backlight panel as claimed in claim 10, further comprising a brightness enhancement film and/or a dual brightness enhancement film over the diffusion plate.

* * * * *